(12) United States Patent
Wu et al.

(10) Patent No.: US 11,545,200 B1
(45) Date of Patent: Jan. 3, 2023

(54) DATA CONTROL CIRCUIT FOR INCREASING MAXIMUM AND MINIMUM TOLERANCE VALUES OF SKEW BETWEEN DQS SIGNAL AND CLOCK SIGNAL DURING WRITE OPERATION AND ASSOCIATED MEMORY DEVICE

(71) Applicant: Elite Semiconductor Microelectronics Technology Inc., Hsinchu (TW)

(72) Inventors: Po-Hsun Wu, Hsinchu (TW); Jen-Shou Hsu, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 0 days.

(21) Appl. No.: 17/498,773

(22) Filed: Oct. 12, 2021

(51) Int. Cl.
*G11C 7/22* (2006.01)
*G11C 7/10* (2006.01)
*H03K 19/20* (2006.01)

(52) U.S. Cl.
CPC .............. *G11C 7/222* (2013.01); *G11C 7/106* (2013.01); *G11C 7/109* (2013.01); *G11C 7/1063* (2013.01); *G11C 7/1087* (2013.01); *H03K 19/20* (2013.01)

(58) Field of Classification Search
CPC .................................. G11C 7/222; G11C 7/22
USPC ....................................................... 365/233.1
See application file for complete search history.

(56) References Cited

U.S. PATENT DOCUMENTS

| | | | | |
|---|---|---|---|---|
| 5,859,804 | A * | 1/1999 | Hedberg | G11C 29/72 365/201 |
| 6,205,062 | B1 * | 3/2001 | Kim | G11C 7/22 365/194 |
| 6,512,719 | B2 * | 1/2003 | Fujisawa | G11C 7/18 365/194 |
| 7,522,459 | B2 * | 4/2009 | Do | G11C 7/1072 365/219 |
| 7,672,190 | B1 * | 3/2010 | Raza | G11C 8/06 365/230.02 |
| 8,362,802 | B2 * | 1/2013 | Nowick | H03K 19/20 713/400 |
| 10,572,406 | B2 | 2/2020 | Oh | |
| 10,606,512 | B2 | 3/2020 | Mazumder | |
| 2007/0058459 | A1 * | 3/2007 | Kitamura | G11C 7/222 365/193 |
| 2007/0223287 | A1 * | 9/2007 | Lee | G11C 7/1066 365/189.05 |

* cited by examiner

*Primary Examiner* — Muna A Techane
(74) *Attorney, Agent, or Firm* — Winston Hsu (57) ABSTRACT

A data control circuit includes a first latch circuit, a self-block circuit, a second latch circuit, a third latch circuit, a first data timing-labeled signal generating circuit, and a second data timing-labeled signal generating circuit. The first latch circuit is arranged to receive a data window signal. The self-block circuit is coupled to the first latch circuit, and is arranged to generate a protection signal. The second latch circuit is coupled to the self-block circuit, and is arranged to output a first data timing-labeled signal. The third latch circuit is coupled to the second latch circuit, and is arranged to generate a second data timing-labeled signal. The first data timing-labeled signal generating circuit is arranged to generate a third data timing-labeled signal. The second data timing-labeled signal generating circuit is arranged to generate a fourth data timing-labeled signal.

12 Claims, 10 Drawing Sheets

DATA CONTROL CIRCUIT FOR INCREASING MAXIMUM AND MINIMUM TOLERANCE VALUES OF SKEW BETWEEN DQS SIGNAL AND CLOCK SIGNAL DURING WRITE OPERATION AND ASSOCIATED MEMORY DEVICE

BACKGROUND OF THE INVENTION

1. Field of the Invention

The present invention is related to a double data rate (DDR) synchronous dynamic random access memory (SDRAM), and more particularly, to a data control circuit for increasing maximum and minimum tolerance values of a skew between a DQS signal and a clock signal during a write operation and associated memory device.

2. Description of the Prior Art

With the development of the DDR SDRAM, due to the high speed of data transmission, tDQSS is defined in specification of the DDR SDRAM, which limits the relative relationship between a rising edge of a data strobe (DQS) signal and that of a clock signal during a write operation. That is, tDQSS represents maximum and minimum tolerance values of a skew between the DQS signal and the clock signal during the write operation. By limiting the size of tDQSS, the DDR SDRAM can be correctly operated and incorrect data can be prevented from being written to the DDR SDRAM. However, in response to the faster and faster data transmission speed of the DDR SDRAM, the value of tDQSS in the specification of DDR SDRAM is also increased. In the specification of DDR2 SDRAM, the value of tDQSS is required to be larger than ±0.25*tCK (clock cycle time). In the specification of DDR3 SDRAM, the value of tDQSS is increased to ±0.27*tCK. In the later development of DDR4 SDRAM, tDQSS2 is defined when DDR4 SDRAM is operated in 2-clock preamble mode, and the value of tDQSS2 may reach ±0.5*tCK.

Generally speaking, the manufacturer of the DDR SDRAM will set the design target of tDQSS to be greater than tDQSS that is defined by the specification of the DDR SDRAM. In the prior art, the value of tDQSS up to ±0.4*tCK can be handled. However, after tDQSS2 appears, requirements of the specification of the DDR4 SDRAM cannot be achieved according to the prior art. In addition, it is usually necessary to accurately achieve the tDQSS of the designed target in the prior art, which results in the design flexibility being not high. As a result, a data control circuit for increasing maximum and minimum tolerance values of the skew between the DQS signal and the clock signal during the write operation and associated memory device are urgently needed.

SUMMARY OF THE INVENTION

It is therefore one of the objectives of the present invention to provide a data control circuit for increasing maximum and minimum tolerance values of a skew between a DQS signal and a clock signal during a write operation and associated memory device, to address above-mentioned issues.

According to one embodiment of the present invention, a data control circuit for increasing maximum and minimum tolerance values of a skew between a DQS signal and a clock signal during a write operation is provided. The data control circuit may include a first latch circuit, a self-block circuit, a second latch circuit, a third latch circuit, a first data timing-labeled signal generating circuit, and a second data timing-labeled signal generating circuit. The first latch circuit has a first clock port, a first input port, and a first output port, wherein the first clock port is arranged to receive a first clock that is derived from a DQS signal, and the first input port is arranged to receive a data window signal. The self-block circuit may be coupled to the first output port of the first latch circuit, and arranged to generate a protection signal according to an output at the first output port of the first latch circuit and a self-block signal. The second latch circuit has a second clock port, a second input port, and a second output port, wherein the second clock port is arranged to receive a second clock that is derived from the DQS signal, the first clock is an inverse of the second clock, the second input port is coupled to the self-block circuit, and is arranged to receive the protection signal, and the second output port is arranged to output a first data timing-labeled signal. The third latch circuit has a third clock port, a third input port, and a third output port, wherein the third clock port is arranged to receive the first clock, the third input port is coupled to the second output port of the second latch circuit, and is arranged to receive the first data timing-labeled signal, and the third output port is arranged to output a second data timing-labeled signal. The first data timing-labeled signal generating circuit may be coupled to the third output port of the third latch circuit, and arranged to generate a third data timing-labeled signal according to the second data timing-labeled signal. The second data timing-labeled signal generating circuit may be coupled to the first data timing-labeled signal generating circuit, and arranged to generate a fourth data timing-labeled signal according to the third data timing-labeled signal.

According to one embodiment of the present invention, a memory device is provided. The memory device may include a command input interface, a command decoder, a memory cell circuit, a data input/output (I/O) interface, and a data processing circuit. The command input interface may be arranged to receive a plurality of command signals. The command decoder may be coupled to the command input interface, and arranged to receive and decode the plurality of command signals, to generate a data window signal and a control signal, wherein the data window signal corresponds to a write command. The memory cell circuit may be coupled to the command decoder, and has a plurality of memory banks, wherein the memory cell circuit is controlled by the control signal. The data I/O interface may be arranged to receive a plurality of data (DQ) signals and a DQS signal, wherein the plurality of DQ signals correspond to a plurality of data to be written. The data processing circuit may include a series to parallel circuit and a data control circuit. The series to parallel circuit may be coupled to the data I/O interface and the memory cell circuit, and arranged to transfer the plurality of DQ signals into a plurality of DQ input signals, wherein the plurality of DQ input signals is transmitted to the memory cell circuit in parallel communication. The data control circuit may be coupled to the command decoder, the data I/O interface, and the series to parallel circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
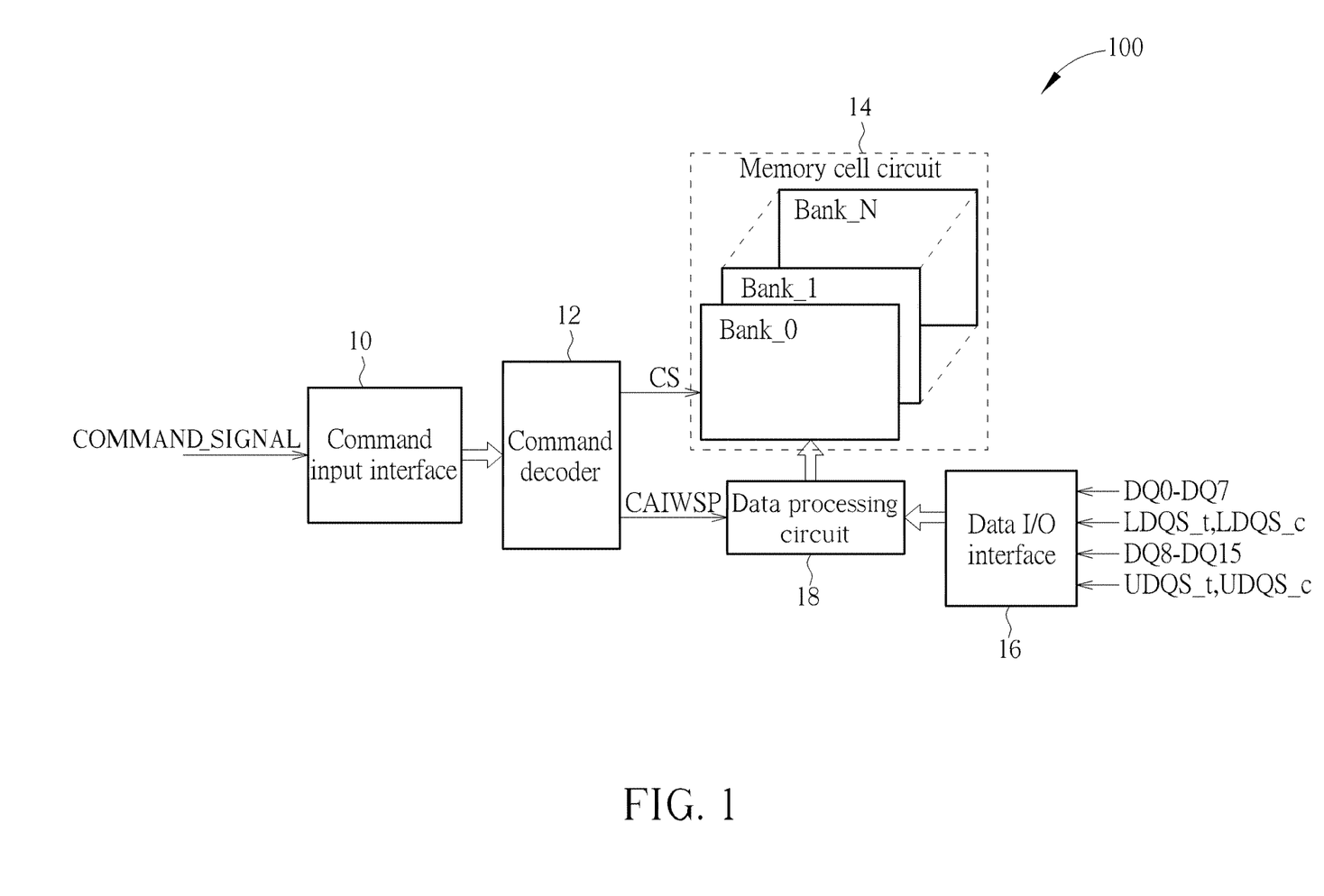
FIG. 1 is a block diagram illustrating a memory device according to an embodiment of the present invention.

FIG. 1 is a block diagram illustrating a memory device 100 according to an embodiment of the present invention. The memory device 100 (e.g. the DDR SDRAM) may include a command input interface 10, a command decoder 12, a memory cell circuit 14, a data input/output (I/O) interface 16, and a data processing circuit 18. The command input interface 10 may be arranged to receive a plurality of command signals COMMAND_SIGNAL, wherein the plurality of command signals COMMAND_SIGNAL may include a write command WR, a differential pair of memory clock signals (i.e. a true clock signal CK_t and a complementary clock signal CK_c), a clock enable signal CKE, a chip select signal CS_n, a plurality of address signals (e.g. BG0, BG1, BA0, BA1, and A0-A13), etc. The command decoder 12 may be coupled to the command input interface 10, and may be arranged to receive and decode the plurality of command signals COMMAND_SIGNAL, to generate a data window signal CAIWSP that corresponds to the write command WR and a control signal CS, wherein the data window signal CAIWSP may be arranged to notify the data processing circuit 18 that the memory device 100 is operated in a write mode, control the data path, and represent maximum and minimum tolerance values of the skew between a data strobe (DQS) signal and a clock signal (e.g. the true clock signal CK_t), and the control signal CS is generated according to the plurality of address signals.

The memory cell circuit 14 may be coupled to the command decoder 12 and the data processing circuit 18, and may have a plurality of memory banks BANK_0-BANK_N, wherein the memory cell circuit 14 is controlled by the control signal CS, the control signal CS may be arranged to determine a memory address in one of the plurality of memory banks BANK_0-BANK_N, and a write operation corresponding to the write command WR is operated on the memory address. The data I/O interface 16 may be arranged to receive a plurality of data (DQ) signals DQ0-DQ7 and DQ8-DQ15, a differential pair of upper DQS signals (i.e. an upper true DQS signal UDQS_t and an upper complementary DQS signal UDQS_c), and a differential pair of lower DQS signals (i.e. a lower true DQS signal LDQS_t and a lower complementary DQS signal LDQS_c), wherein the differential pair of upper DQS signals and the differential pair of lower DQS signals correspond to the plurality of DQ signals DQ8-DQ15 and the plurality of DQ signals DQ0-DQ7, respectively, and the plurality of DQ signals DQ0-DQ7 and DQ8-DQ15 correspond to a plurality of data to be written. The data processing circuit 18 may be coupled to the command decoder 12, the memory cell circuit 14, and the data I/O interface 16, and may be arranged to receive the data window signal CAIWSP, the plurality of DQ signals DQ0-DQ7 and DQ8-DQ15, the differential pair of upper DQS signals, and the differential pair of lower DQS signals, and write the plurality of data to be written into the memory cell circuit 14 (more particularly, memory cells at the memory address determined by the control signal CS) according to the data window signal CAIWSP.

Figure 2:
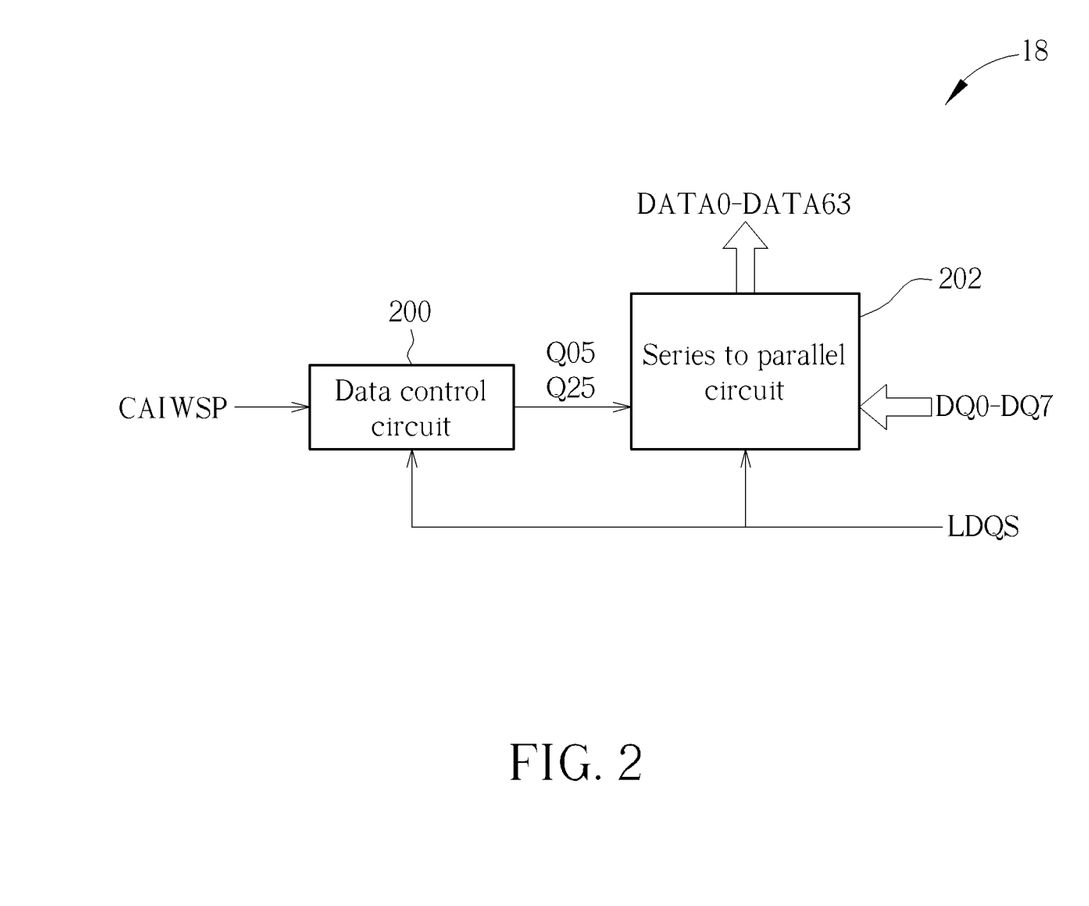
FIG. 2 is a block diagram illustrating the data processing circuit shown in FIG. 1 according to an embodiment of the present invention.

FIG. 2 is a block diagram illustrating the data processing circuit 18 shown in FIG. 1 according to an embodiment of the present invention. As shown in FIG. 2, the data processing circuit 18 shown in FIG. 1 may include a data control circuit 200 and a series to parallel circuit 202, wherein the data control circuit 200 is coupled to the series to parallel circuit 202. In this embodiment, the plurality of DQ signals DQ0-DQ7 may be transmitted to the series to parallel circuit 202, and a lower DQS signal LDQS may be transmitted to the data control circuit 200 and the series to parallel circuit 202, wherein the plurality of DQ signals DQ0-DQ7 are transmitted in series communication, and the lower DQS signal LDQS may be generated by transmitting the lower true DQS signal LDQS_t to the data control circuit 200 and the series to parallel circuit 202 through an input buffer in the data I/O interface 16, but the present invention is not limited thereto. In some embodiments, the plurality of DQ signals DQ8-DQ15 may be transmitted to the series to parallel circuit 202, and a upper DQS signal UDQS may be transmitted to the data control circuit 200 and the series to parallel circuit 202, wherein the upper DQS signal UDQS may be generated by transmitting the upper true DQS signal UDQS_t to the data control circuit 200 and the series to parallel circuit 202 through an input buffer in the data I/O interface 16.

In this embodiment, the data control circuit 200 may be arranged to generate and transmit a second data timing-labeled signal Q05 and a fourth data timing-labeled signal Q25 to the series to parallel circuit 202 according to the lower DQS signal LDQS, wherein timings of the plurality of data to be written are labeled by the second data timing-labeled signal Q05 and the fourth data timing-labeled signal Q25, respectively. The series to parallel circuit 202 may be arranged to transfer the plurality of DQ signals DQ0-DQ7 that are transmitted in series communication into a plurality of DQ input signals DATA0-DATA63 that are transmitted in parallel communication according to the lower DQS signal LDQS, second data timing-labeled signal Q05, and the fourth data timing-labeled signal Q25, respectively, and transmit the plurality of DQ input signals DATA0-DATA63 to the memory cell circuit 14. For example, the DQ signal DQ0 is transferred into a plurality of DQ input signals DATA0-DATA7 of the plurality of DQ input signals DATA0-DATA63, and the DQ signal DQ1 is transferred into a plurality of DQ input signals DATA8-DATA15 of the plurality of DQ input signals DATA0-DATA63. For brevity, similar descriptions for this embodiment are not repeated in detail here.

Figure 3:
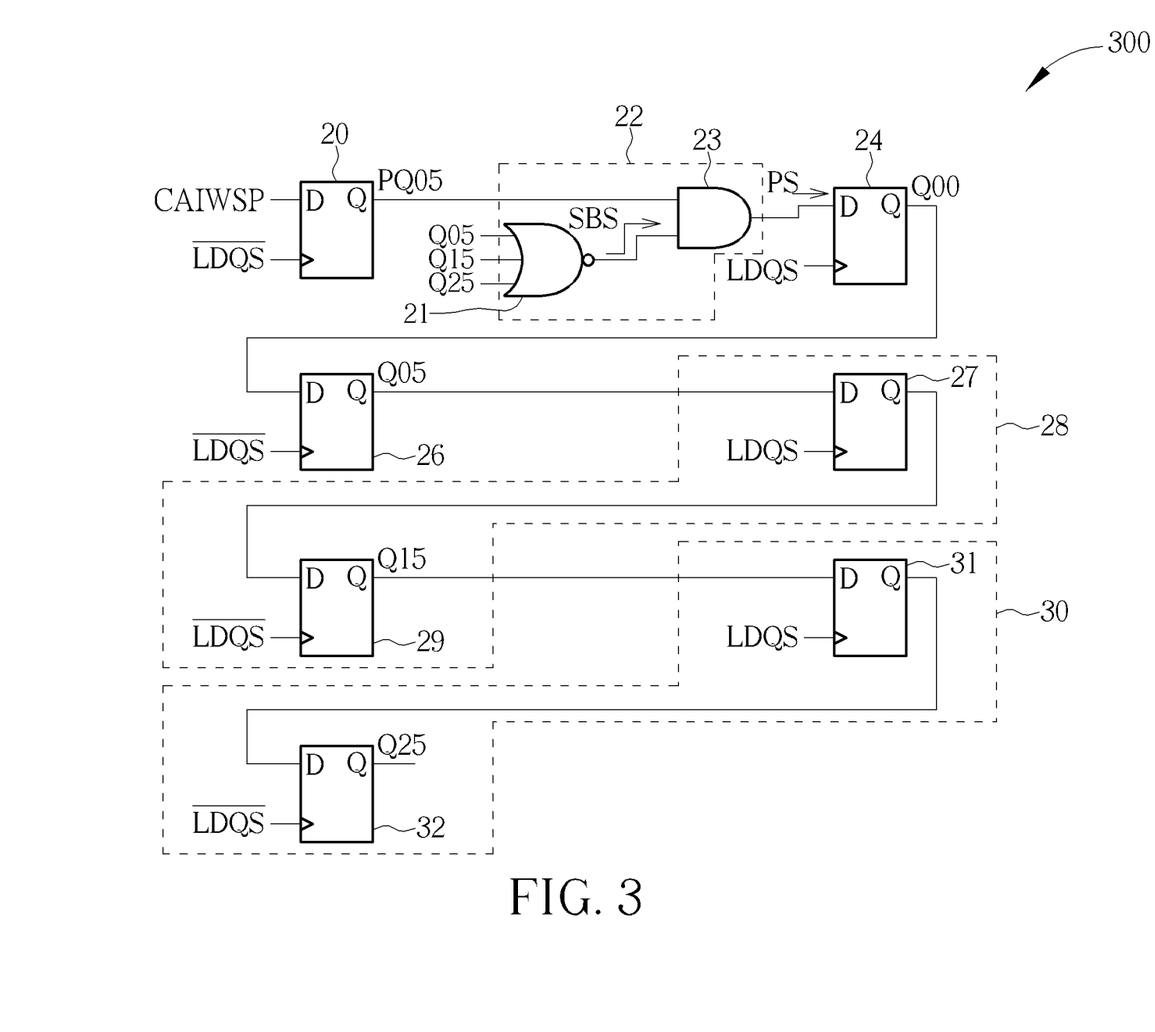
FIG. 3 is a diagram illustrating the data control circuit shown in FIG. 2 according to an embodiment of the present invention.

FIG. 3 is a diagram illustrating the data control circuit 200 shown in FIG. 2 according to an embodiment of the present invention. The data control circuit 200 shown in FIG. 2 may be realized by a data control circuit 300 shown in FIG. 3. In this embodiment, it should be noted that the data control circuit 300 may be arranged to generate a first data timing-labeled signal Q00, the second data timing-labeled signal Q05, a third data timing-labeled signal Q15, and the fourth data timing-labeled signal Q25 according to the true clock signal CK_t and the lower DQS signal LDQS, wherein the true clock signal CK_t belongs to clock-domain, and the lower DQS signal LDQS, the first data timing-labeled signal Q00, the second data timing-labeled signal Q05, the third data timing-labeled signal Q15, and the fourth data timing-labeled signal Q25 belong to DQS-domain, but the present invention is not limited thereto. In addition, the data control circuit 300 may be arranged to transfer the data window signal CAIWSP that corresponds to the write command WR from clock-domain to DQS-domain.

As shown in FIG. 3, the data control circuit 300 may include a plurality of latch circuits 20, 24, and 26, a self-block circuit 22, and two data timing-labeled signal generating circuits 28 and 30. The latch circuit 20 has a first clock port, a first input port D, and a first output port Q, wherein the first clock port may be arranged to receive an inverse of the lower DQS signal LDQS (labeled as "$\overline{LDQS}$" in FIG. 3), and the first input port D may be arranged to receive the data window signal CAIWSP. The self-block circuit 22 may be coupled to the first output port Q of the latch circuit 20, and arranged to generate a protection signal PS according to an output at the first output port Q of the latch circuit 20 that is labeled as "PQ05" in FIG. 3 (for brevity, hereinafter referred to as a signal PQ05) and a self-block signal SBS, wherein the self-block signal SBS is generated according to the second data timing-labeled signal Q05, the third data timing-labeled signal Q15, and the fourth data timing-labeled signal Q25.

For example, in this embodiment, the self-block circuit 22 may include a NOR gate circuit 21 and an AND gate circuit 23, wherein the NOR gate circuit 21 may be arranged to receive the second data timing-labeled signal Q05, the third data timing-labeled signal Q15, and the fourth data timing-labeled signal Q25, to generate the self-block signal SBS, and the AND gate circuit 23 may be coupled to the first output port Q of the latch circuit 20 and the NOR gate circuit 21, and may be arranged to receive the signal PQ05 and the self-block signal SBS, to generate the protection signal PS.

The latch circuit 24 has a second clock port, a second input port D, and a second output port Q, wherein the second clock port may be arranged to receive the lower DQS signal LDQS, the second input port D may be coupled to the self-block circuit 22, and may be arranged to receive the protection signal PS, and the second output port Q may be arranged to output the first data timing-labeled signal Q00. The latch circuit 26 has a third clock port, a third input port D, and a third output port Q, wherein the third clock port may be arranged to receive the inverse of the lower DQS signal LDQS, the third input port D may be coupled to the second output port Q of the latch circuit 24, and may be arranged to receive the first data timing-labeled signal Q00, and the third output port Q may be arranged to output the second data timing-labeled signal Q05.

The data timing-labeled signal generating circuit 28 may be coupled to the third output port Q of the latch circuit 26, and may be arranged to generate the third data timing-labeled signal Q15 according to the second data timing-labeled signal Q05. In this embodiment, the data timing-labeled signal generating circuit 28 may include two latch circuits 27 and 29. The latch circuit 27 has a fourth clock port, a fourth input port D, and a fourth output port Q, wherein the fourth clock port may be arranged to receive the lower DQS signal LDQS, and the fourth input port D may be coupled to the third output port Q of the latch circuit 26, and may be arranged to receive the second data timing-labeled signal Q05. The latch circuit 29 has a fifth clock port, a fifth input port D and a fifth output port Q, wherein the fifth clock port may be arranged to receive the inverse of the lower DQS signal LDQS, the fifth input port D may be coupled to the fourth output port Q of the latch circuit 27, and may be arranged to receive an output at the fourth output port Q of the latch circuit 27, and the fifth output port Q may be arranged to output the third data timing-labeled signal Q15.

The data timing-labeled signal generating circuit 30 may be coupled to the data timing-labeled signal generating circuit 28, and may be arranged to generate the fourth data timing-labeled signal Q25 according to the third data timing-labeled signal Q15. In this embodiment, the data timing-labeled signal generating circuit 30 may include two latch circuits 31 and 32. The latch circuit 31 has a sixth clock port, a sixth input port D, and a sixth output port Q, wherein the sixth clock port may be arranged to receive the lower DQS signal LDQS, and the sixth input port D may be coupled to the data timing-labeled signal generating circuit 28, and may be arranged to receive the third data timing-labeled signal Q15. The latch circuit 32 has a seventh clock port, a seventh input port D and a seventh output port Q, wherein the seventh clock port may be arranged to receive the inverse of the lower DQS signal LDQS, the seventh input port D may be coupled to the sixth output port Q of the latch circuit 31, and may be arranged to receive an output at the sixth output port Q of the latch circuit 31, and the seventh output port Q may be arranged to output the fourth data timing-labeled signal Q25.

In addition, it should be noted that each of the latch circuit 20, the latch circuit 24, the latch circuit 26, the latch circuit 27, the latch circuit 29, the latch circuit 31, and the latch circuit 32 is a D-latch circuit, but the present invention is not limited thereto.

Figure 4:
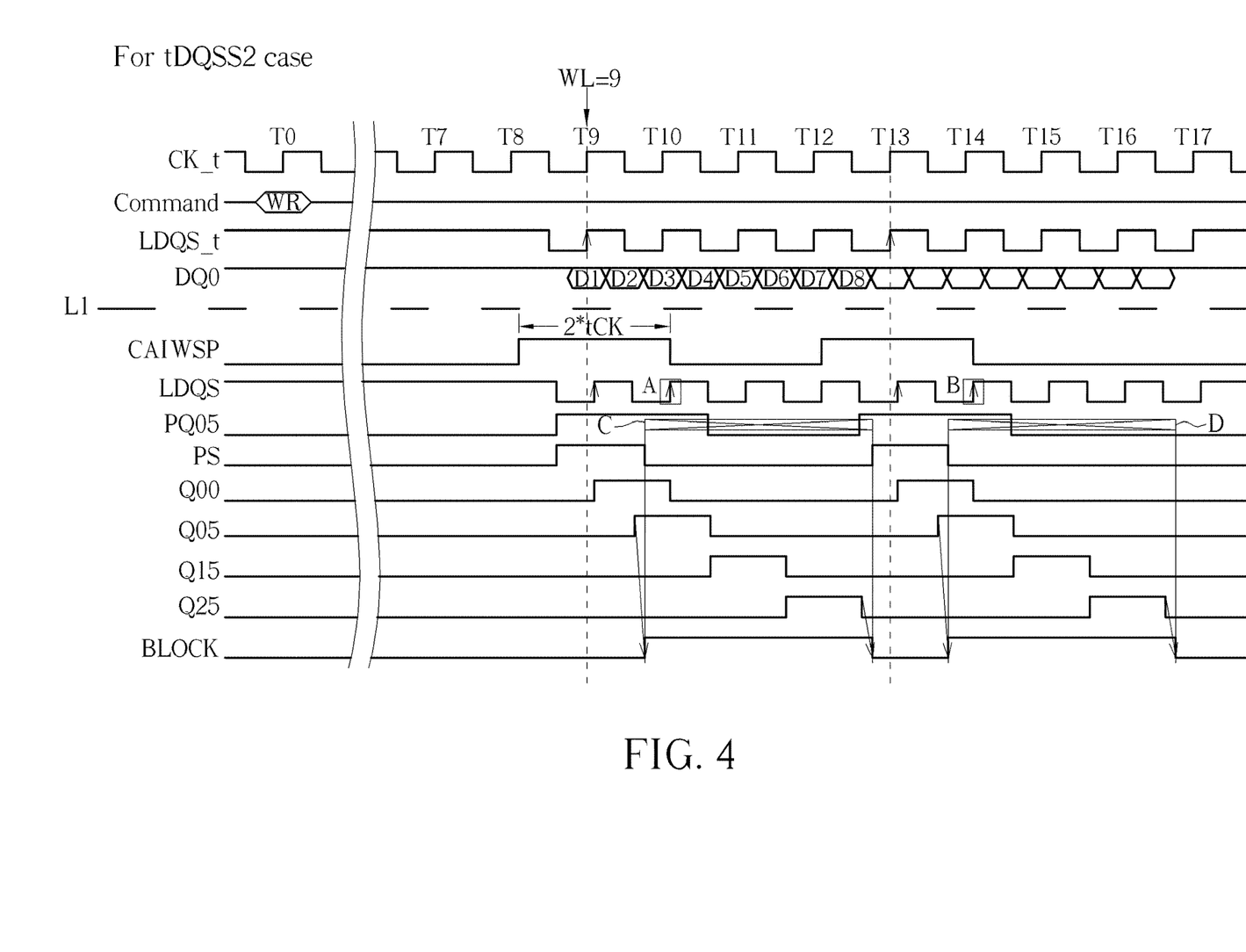
FIG. 4 is a timing diagram of a clock signal, a DQS signal, a data window signal, and a plurality of data timing-labeled signals obtained by the data control circuit shown in FIG. 3 for tDQSS2 case according to an embodiment of the present invention.

FIG. 4 is a timing diagram of a clock signal, a DQS signal, a data window signal, and a plurality of data timing-labeled signals obtained by the data control circuit 300 shown in FIG. 3 for tDQSS2 case according to an embodiment of the present invention. It is assumed that the plurality of DQ signals DQ0-DQ7 (DQ1-DQ7 not shown in FIG. 4) that correspond to 8 write data (labeled as "D1-D8" in FIG. 4, respectively) are transmitted to the data processing circuit 18 after the write command WR is operated. It should be noted that, during a period spanning from time point T9 to time point T13, the 8 write data are transmitted to the data processing circuit 18 in series communication, and timings of the 8 write data are labeled by the second data timing-labeled signal Q05 and the fourth data timing-labeled signal Q25, respectively. However, after the time point T13, the 8 write data are transmitted to the memory cell circuit 14 in parallel communication.

As shown in FIG. 4, the write command WR is given at a time point TO, and a write latency WL is equal to 9 (i.e. the write command WR is first operated at the time point T9, and the transmission of the plurality of DQ signals DQ0-DQ7 starts at the time point T9). In this embodiment, the column to column delay time (tCCD) is equal to 4. That is, the time interval between operating timings of two adjacent write commands is 4*tCK. In addition, a block signal BLOCK is a sum of the second data timing-labeled signal Q05, the third data timing-labeled signal Q15, and the fourth data timing-labeled signal Q25 (e.g. a result of ORing the second data timing-labeled signal Q05, the third data timing-labeled signal Q15, and the fourth data timing-labeled signal Q25), and is an inverse of the self-block signal SBS. The signals illustrated above a dashed line L1 (i.e. the true clock signal CK_t and the lower true DQS signal LDQS_t) are external signals of the memory device 100, and the signals illustrated below the dashed line L1 (i.e. the data window signal CAIWSP, the lower DQS signal LDQS, the signal PQ05, the protection signal PS, the first data timing-labeled signal Q00, the second data timing-labeled signal Q05, the third data timing-labeled signal Q15, the fourth data timing-labeled signal Q25, and the block signal BLOCK) are internal signals of the data control circuit 300.

In addition, the pulse width of the data window signal CAIWSP is 2*tCK, and the lower DQS signal LDQS toggles 4 times every 4 time periods (e.g. from the time point T9 to the time point T13) for the 8 write data. Ideally, the rising edge of the lower DQS signal LDQS should strobe the data window signal CAIWSP at the time point T9. However, since the lower DQS signal LDQS may be generated by transmitting the lower true DQS signal LDQS_t to the data control circuit 300 through an input buffer, the rising edge of the lower DQS signal LDQS strobes the data window signal CAIWSP near the time point T9.

Consider a case where the latch circuit 24 is directly coupled to the latch circuit 20, that is, a case where the data control circuit 300 is modified to have the self-block circuit 22 omitted therefrom. Since the signal PQ05 is strobed by the high level of the lower DQS signal LDQS and the level of the signal PQ05 is high at a position A that is labeled in FIG. 4, the level of the first data timing-labeled signal Q00 will keep high until a time point T11, which may result in the 8 write data being written at wrong timings. That is, the timings of the second data timing-labeled signal Q05, the third data timing-labeled signal Q15, and the fourth data timing-labeled signal Q25 may be wrong. In addition, since the signal PQ05 is strobed by the high level of the lower DQS signal LDQS and the level of the signal PQ05 is high at a position B that is labeled in FIG. 4, the level of the first data timing-labeled signal Q00 will keep high until a time point T15, which also results in the 8 write data being written at wrong timings.

In this embodiment having the self-block circuit 22 implemented in the data control circuit 300, the block signal BLOCK may be arranged to avoid the above-mentioned situation, and the signal PQ05 is blocked by the block signal BLOCK at a position C and a position D. That is, the level of the protection signal PS (which is derived from ANDing the signal PQ05 and an inverse of the block signal BLOCK (i.e. the self-block signal SBS)) is low at the timing region covered by the position C and position D. Since the protection signal PS is low at positions A and B and strobed by the high level of the lower DQS signal LDQS, the level of the first data timing-labeled signal Q00 becomes low at the positions A and B. As a result, the timings of the first data timing-labeled signal Q00, the second data timing-labeled signal Q05, the third data timing-labeled signal Q15, and the fourth data timing-labeled signal Q25 may be correct, and the 8 write data may be written into the memory cell circuit 14 correctly by using the data control circuit 300 of the present invention.

Figure 5:
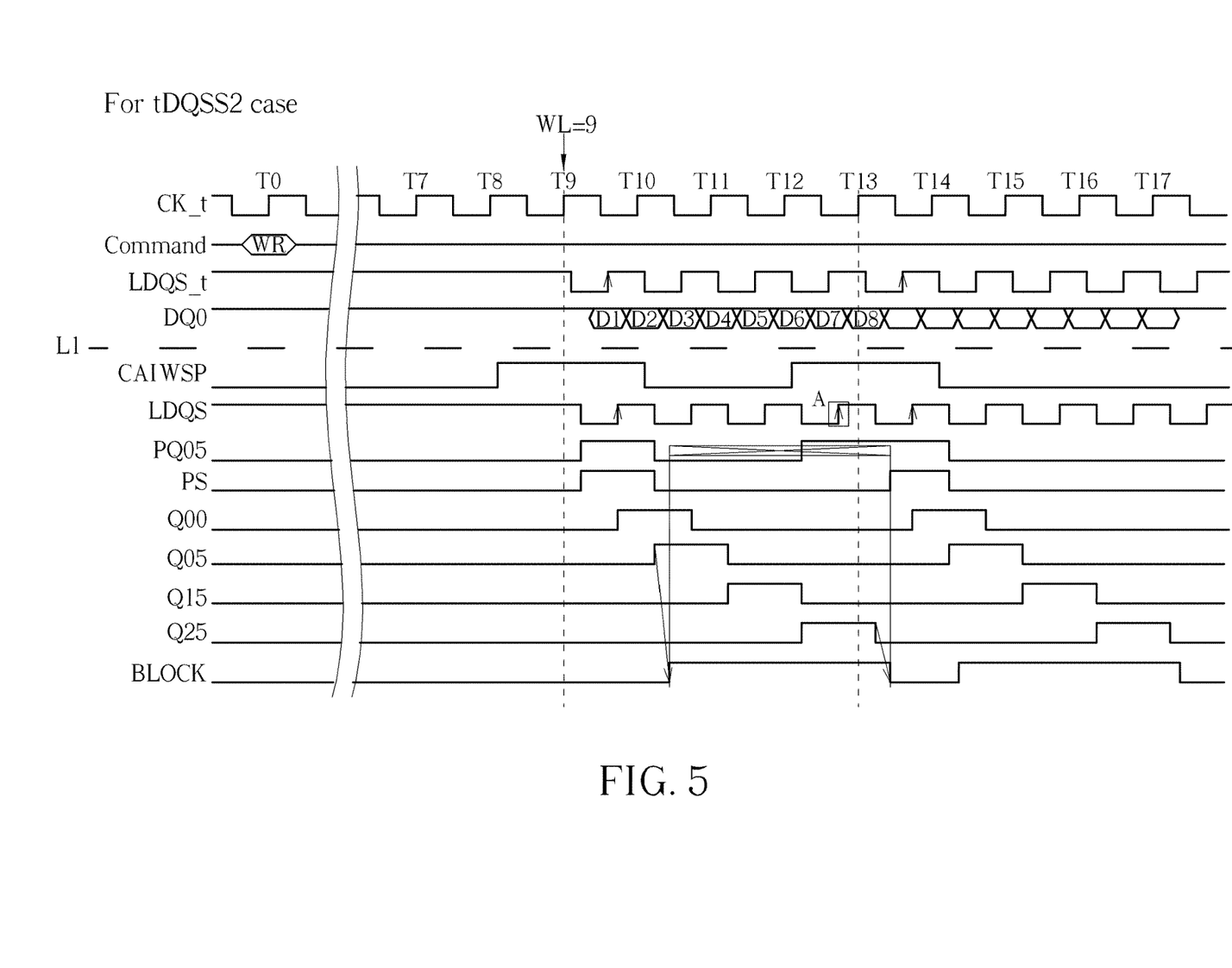
FIG. 5 is a timing diagram of a clock signal, a DQS signal that first rises after operated timing of a write command, a data window signal, and a plurality of data timing-labeled signals obtained by the data control circuit shown in FIG. 3 for tDQSS2 case according to an embodiment of the present invention.

FIG. 5 is a timing diagram of a clock signal, a DQS signal that first rises after operated timing of a write command, and a plurality of data timing-labeled signals obtained by the data control circuit 300 shown in FIG. 3 for tDQSS2 case according to an embodiment of the present invention. The difference between FIG. 4 and FIG. 5 is that the first rising edge of the lower DQS signal LDQS is near a middle timing between the time point T9 and a time point T10 (which is still in a range of the data window signal CAIWSP) instead of near the time point T9. For brevity, similar description is omitted here. If the data control circuit 300 is modified to have the self-block circuit 22 omitted therefrom, at a position A that is labeled in FIG. 5, since the signal PQ05 is a high level signal and strobed by the high level of the lower DQS signal LDQS, the level of the first data timing-labeled signal Q00 will be from low to high before a correct timing (i.e. the timing near a middle timing between the time points T13 and T14), which may result in the 8 write data being written at wrong timings.

In this embodiment having the self-block circuit 22 implemented in the data control circuit 300, since the block signal BLOCK is high at position A, the protection signal PS (which is derived from ANDing the signal PQ05 and an inverse of the block signal BLOCK (i.e. the self-block signal SBS)) will keep low at the position A, which makes the first data timing-labeled signal Q00 still be a low level signal until the correct timing (i.e. the timing near a middle timing between the time points T13 and T14). As a result, the timings of the second data timing-labeled signal Q05, the third data timing-labeled signal Q15, and the fourth data timing-labeled signal Q25 may be correct, and the 8 write data may be written into the memory cell circuit 14 correctly by using the data control circuit 300 of the present invention.

Figure 6:
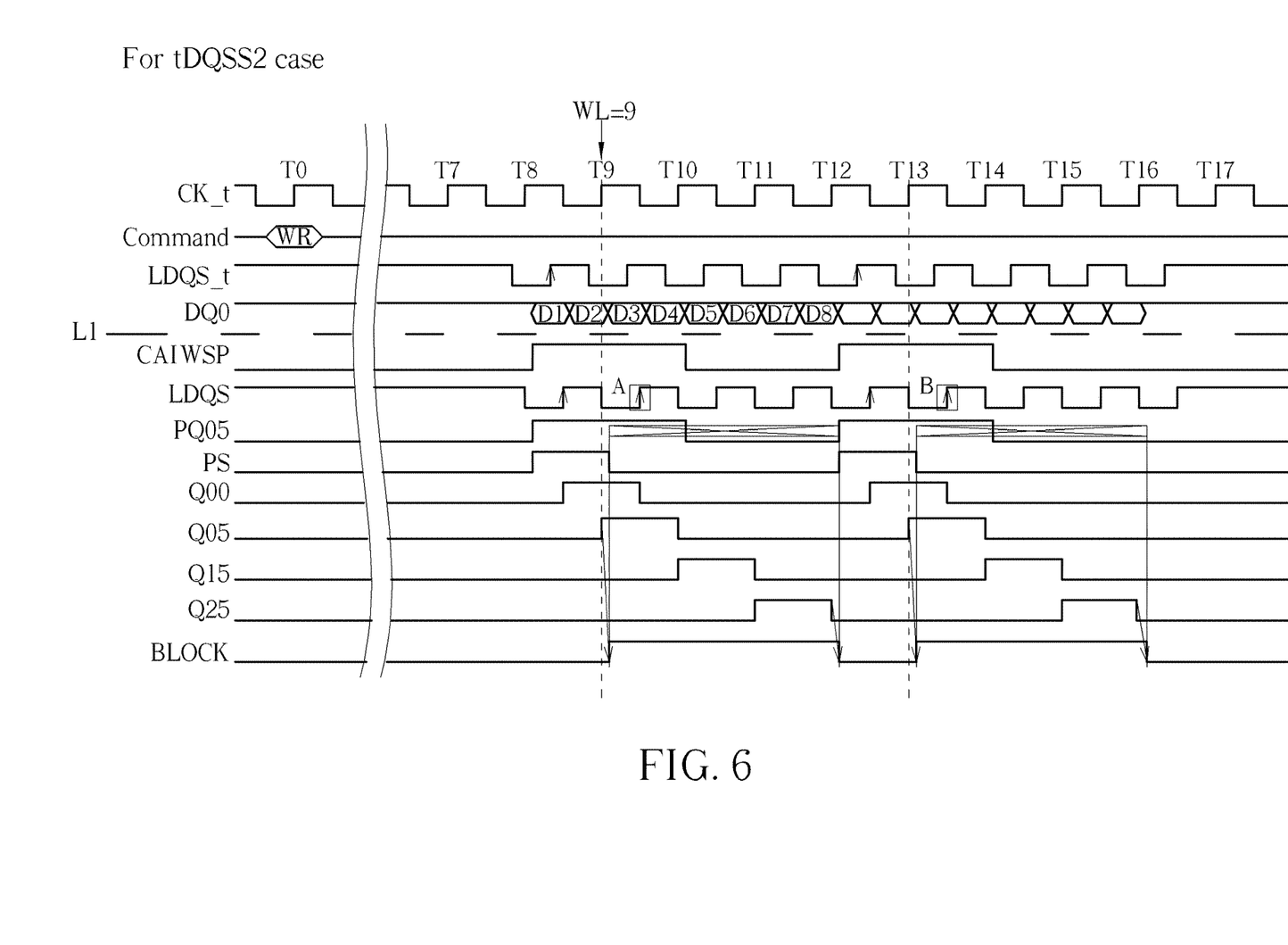
FIG. 6 is a timing diagram of a clock signal, a DQS signal that first rises before operated timing of a write command, a data window signal, and a plurality of data timing-labeled signals obtained by the data control circuit shown in FIG. 3 for tDQSS2 case according to an embodiment of the present invention.

FIG. 6 is a timing diagram of a clock signal, a DQS signal that first rises before operated timing of a write command, and a plurality of data timing-labeled signals obtained by the data control circuit 300 shown in FIG. 3 for tDQSS2 case. The difference between FIG. 4 and FIG. 6 is that the first rising edge of the lower DQS signal LDQS is near a middle timing between a time point T8 and the time point T9 (which is still in a range of the data window signal CAIWSP) instead of near the time point T9. For brevity, similar description is omitted here. If the data control circuit 300 is modified to have the self-block circuit 22 omitted therefrom, at a position A that is labeled in FIG. 6, since the signal PQ05 is a high level signal and strobed by the high level of the lower DQS signal LDQS, the level of the first data timing-labeled signal Q00 will keep high until the timing near a middle timing between the time points T10 and T11, which may result in the 8 write data being written at wrong timings. That is, the timings of the second data timing-labeled signal Q05, the third data timing-labeled signal Q15, and the fourth data timing-labeled signal Q25 may be wrong. In addition, at a position B that is labeled in FIG. 6, since the signal PQ05 is a high level signal and strobed by the high level of the lower DQS signal LDQS, the level of the first data timing-labeled signal Q00 will keep high until the timing near a middle timing between the time points T14 and T15, which may also result in the 8 write data being written at wrong timings.

In this embodiment having the self-block circuit 22 implemented in the data control circuit 300, since the block signal BLOCK is high at positions A and B, the level of the protection signal PS (which is derived from ANDing the signal PQ05 and an inverse of the block signal BLOCK (i.e. the self-block signal SBS)) is low at the positions A and B, which makes the first data timing-labeled signal Q00 become a low level signal at the positions A and B. As a result, the timings of the second data timing-labeled signal Q05, the third data timing-labeled signal Q15, and the fourth data timing-labeled signal Q25 may be correct, and the 8 write data may be written into the memory cell circuit 14 correctly by using the data control circuit 300 of the present invention.

Figure 7:
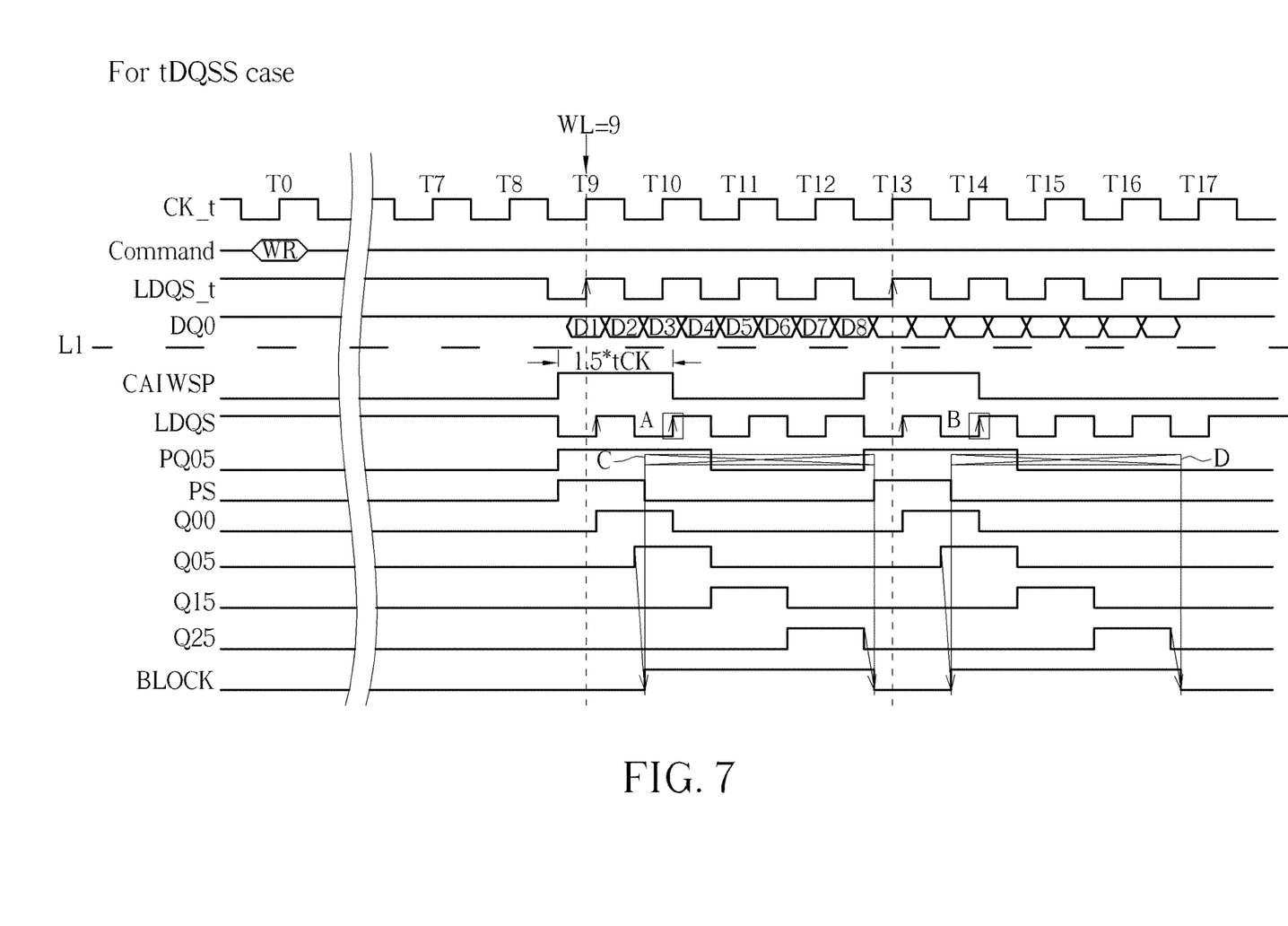
FIG. 7 is a timing diagram of a clock signal, a DQS signal, a data window signal, and a plurality of data timing-labeled signals obtained by the data control circuit shown in FIG. 3 for tDQSS case according to an embodiment of the present invention.

For tDQSS case, in the prior art, the pulse width of the data window signal may reach 1*tCK, which can handle the value of tDQSS in the specification of DDR SDRAM up to ±0.4*tCK. In practice, it is difficult to make the pulse width of the data window signal be 1*tCK precisely. FIG. 7 is a timing diagram of a clock signal, a DQS signal, a data window signal, and a plurality of data timing-labeled signals obtained by the data control circuit 300 shown in FIG. 3 for tDQSS case according to an embodiment of the present invention. In this embodiment, the pulse width of the data window signal CAIWSP is enlarged to 1.5*tCK. Once the pulse width of the data window signal CAIWSP is larger than 1*tCK, it is easier for the manufacturer of the DDR SDRAM to manufacture the DDR SDRAM. It should be noted that 1.5*tCK is only one exemplary implementation of the pulse width of the data window signal CAIWSP achieved by the data control circuit 300 of the present invention. In practice, the pulse width of the data window signal CAIWSP may be other lengths of tCK (e.g. 1.3*tCK or 1.4*tCK). As a result, the design flexibility of the present invention is higher than that of the prior art. The details of signals shown in FIG. 7 have been described in the above-mentioned embodiments. For brevity, similar description is omitted here.

In this embodiment, the signal PQ05 is blocked by the block signal BLOCK at a position C and a position D. That is, the level of the protection signal PS (which is derived from ANDing the signal PQ05 and an inverse of the block signal BLOCK (i.e. the self-block signal SBS)) is low at the timing region covered by the position C and position D. Since the protection signal PS is low at a position A and a position B and strobed by the high level of the lower DQS signal LDQS, the level of the first data timing-labeled signal Q00 is also low. As a result, the timings of the first data timing-labeled signal Q00, the second data timing-labeled signal Q05, the third data timing-labeled signal Q15, and the fourth data timing-labeled signal Q25 may be correct, and the 8 write data may be written into the memory cell circuit 14 correctly by using the data control circuit 300 of the present invention.

Figure 8:
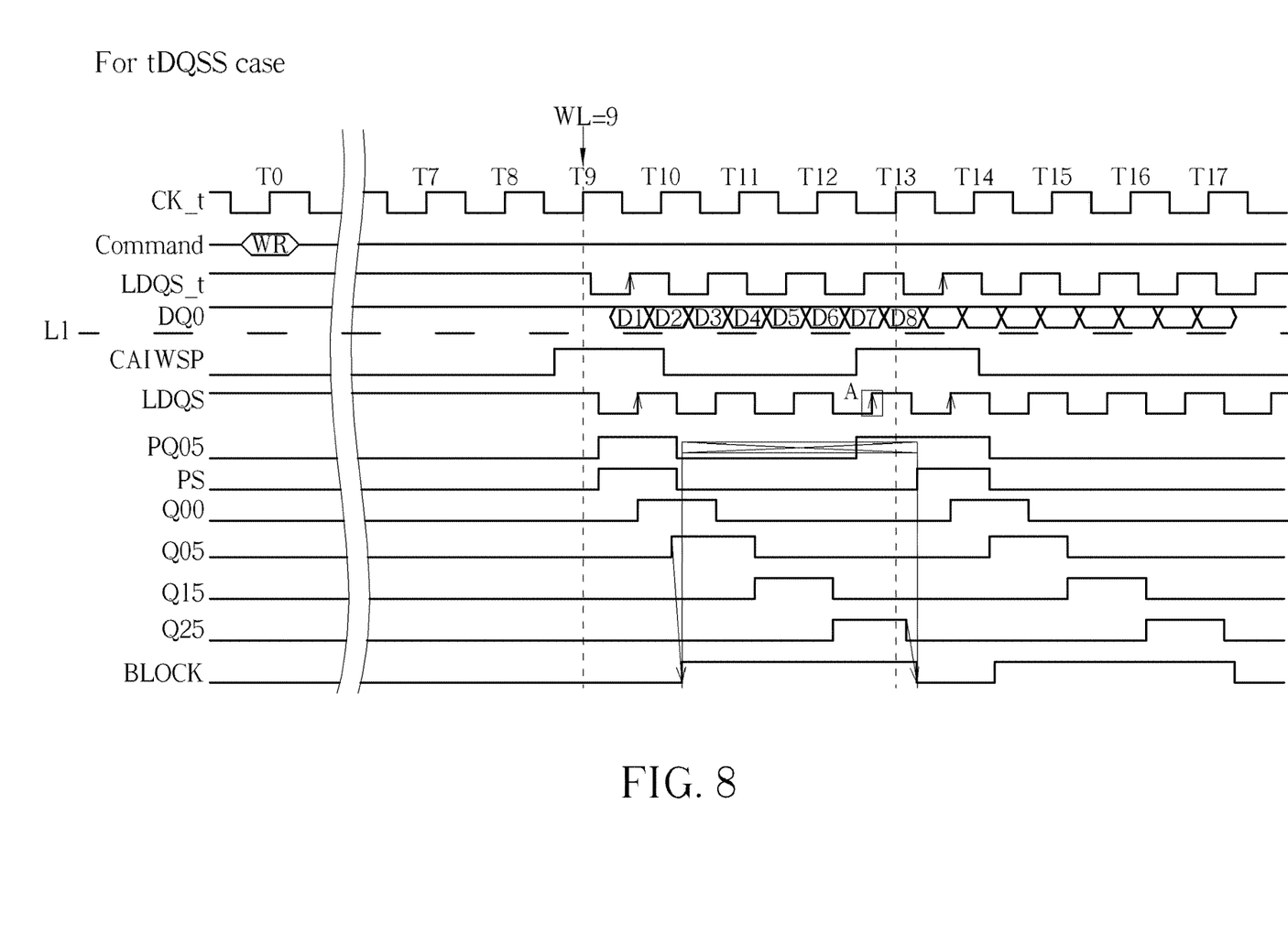
FIG. 8 is a timing diagram of a clock signal, a DQS signal that first rises after operated timing of a write command, a data window signal, and a plurality of data timing-labeled signals obtained by the data control circuit shown in FIG. 3 for tDQSS case according to an embodiment of the present invention.

FIG. 8 is a timing diagram of a clock signal, a DQS signal that first rises after operated timing of a write command, a data window signal, and a plurality of data timing-labeled signals obtained by the data control circuit 300 shown in FIG. 3 for tDQSS case according to an embodiment of the present invention. The difference between FIG. 7 and FIG. 8 is that the first rising edge of the lower DQS signal LDQS is near a middle timing between the time point T9 and the time point T10 (which is still in a range of the data window signal CAIWSP) instead of near the time point T9. For brevity, similar description is omitted here. If the data control circuit 300 is modified to have the self-block circuit 22 omitted therefrom, at a position A that is labeled in FIG. 8, since the signal PQ05 is a high level signal and strobed by the high level of the lower DQS signal LDQS, the level of the first data timing-labeled signal Q00 will be from low to high before the correct timing (i.e. the timing near a middle timing between the time points T13 and T14), which may result in the 8 write data being written at wrong timings.

In this embodiment having the self-block circuit 22 implemented in the data control circuit 300, since the block signal BLOCK is high at position A, the protection signal PS (which is derived from ANDing the signal PQ05 and an inverse of the block signal BLOCK (i.e. the self-block signal SBS)) will keep low at the position A, which makes the first data timing-labeled signal Q00 still be a low level signal until the timing near a middle timing of the time points T13 and T14. As a result, the timings of the second data timing-labeled signal Q05, the third data timing-labeled signal Q15, and the fourth data timing-labeled signal Q25 may be correct, and the 8 write data may be written into the memory cell circuit 14 correctly by using the data control circuit 300 of the present invention.

Figure 9:
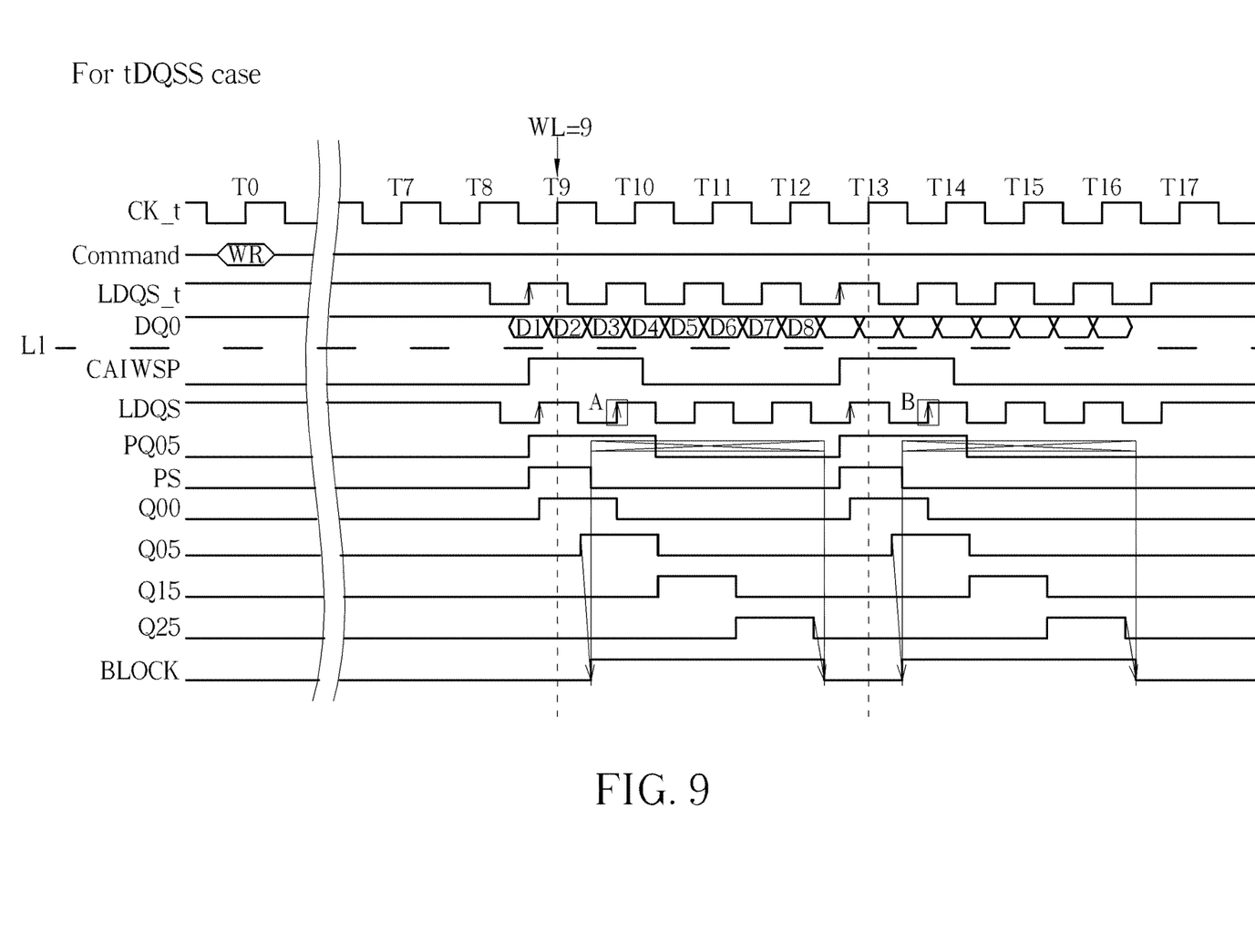
FIG. 9 is a timing diagram of a clock signal, a DQS signal that first rises before operated timing of a write command, a data window signal, and a plurality of data timing-labeled signals obtained by the data control circuit shown in FIG. 3 for tDQSS case according to an embodiment of the present invention.

FIG. 9 is a timing diagram of a clock signal, a DQS signal that first rises before operated timing of a write command, a data window signal, and a plurality of data timing-labeled signals obtained by the data control circuit 300 shown in FIG. 3 for tDQSS case according to an embodiment of the present invention. The difference between FIG. 7 and FIG. 9 is that the first rising edge of the lower DQS signal LDQS is near a middle timing between the time point T8 and the time point T9 (which is still in a range of the data window signal CAIWSP) instead of near the time point T9. For brevity, similar description is omitted here. If the data control circuit 300 is modified to have the self-block circuit 22 omitted therefrom, at a position A that is labeled in FIG. 9, since the signal PQ05 is a high level signal and strobed by the high level of the lower DQS signal LDQS, the level of the first data timing-labeled signal Q00 will keep high until the timing near a middle timing between the time points T10 and Ill, which may result in the 8 write data being written at wrong timings. That is, the timings of the second data timing-labeled signal Q05, the third data timing-labeled signal Q15, and the fourth data timing-labeled signal Q25 may be wrong. In addition, at a position B that is labeled in FIG. 9, since the signal PQ05 is a high level signal and strobed by the high level of the lower DQS signal LDQS, the level of the first data timing-labeled signal Q00 will keep high until the timing near a middle timing between the time points T14 and T15, which may also result in the 8 write data being written at wrong timings.

In this embodiment having the self-block circuit 22 implemented in the data control circuit 300, since the block signal BLOCK is high at positions A and B, the level of the protection signal PS (which is derived from ANDing the signal PQ05 and an inverse of the block signal BLOCK (i.e. the self-block signal SBS)) is low at the positions A and B, which makes the first data timing-labeled signal Q00 become a low level signal at the positions A and B. As a result, the timings of the second data timing-labeled signal Q05, the third data timing-labeled signal Q15, and the fourth data timing-labeled signal Q25 may be correct, and the 8 write data may be written into the memory cell circuit 14 correctly by using the data control circuit 300 of the present invention.

TABLE 1

| Write format | Block signal width |
|---|---|
| BL4 | 1*tCK |
| BL8 | 3*tCK |
| BL4 at CRC mode | 4*tCK |
| BL8 at CRC mode | 4*tCK |

For different burst length, the write formats of the DDR4 SDRAM (e.g. BL4, BL8, BL4 at cyclic redundancy check (CRC) mode, or BL8 at CRC mode), may all be applied to the data control circuit provided by the present invention. For example, a write command corresponds to 4 write data for the write format BL4 may be applied to the data control circuit provided by the present invention. Table 1 illustrates the width of the block signal BLOCK used in the data control circuit of the present invention for different write formats of the DDR4 SDRAM. For the write format BL4, the lower DQS signal LDQS toggles 2 times for 4 write data and the width of the block signal BLOCK is 1*tCK. For the write format BL8 (which is applied to the above-mentioned embodiments), the lower DQS signal LDQS toggles 4 times for 8 write data and the width of the block signal BLOCK is 3*tCK. For the write formats BL4 at CRC mode and BL8 at CRC mode, the lower DQS signal LDQS toggles 5 times for 9 write data and the width of the block signal BLOCK is 4*tCK.

Figure 10:
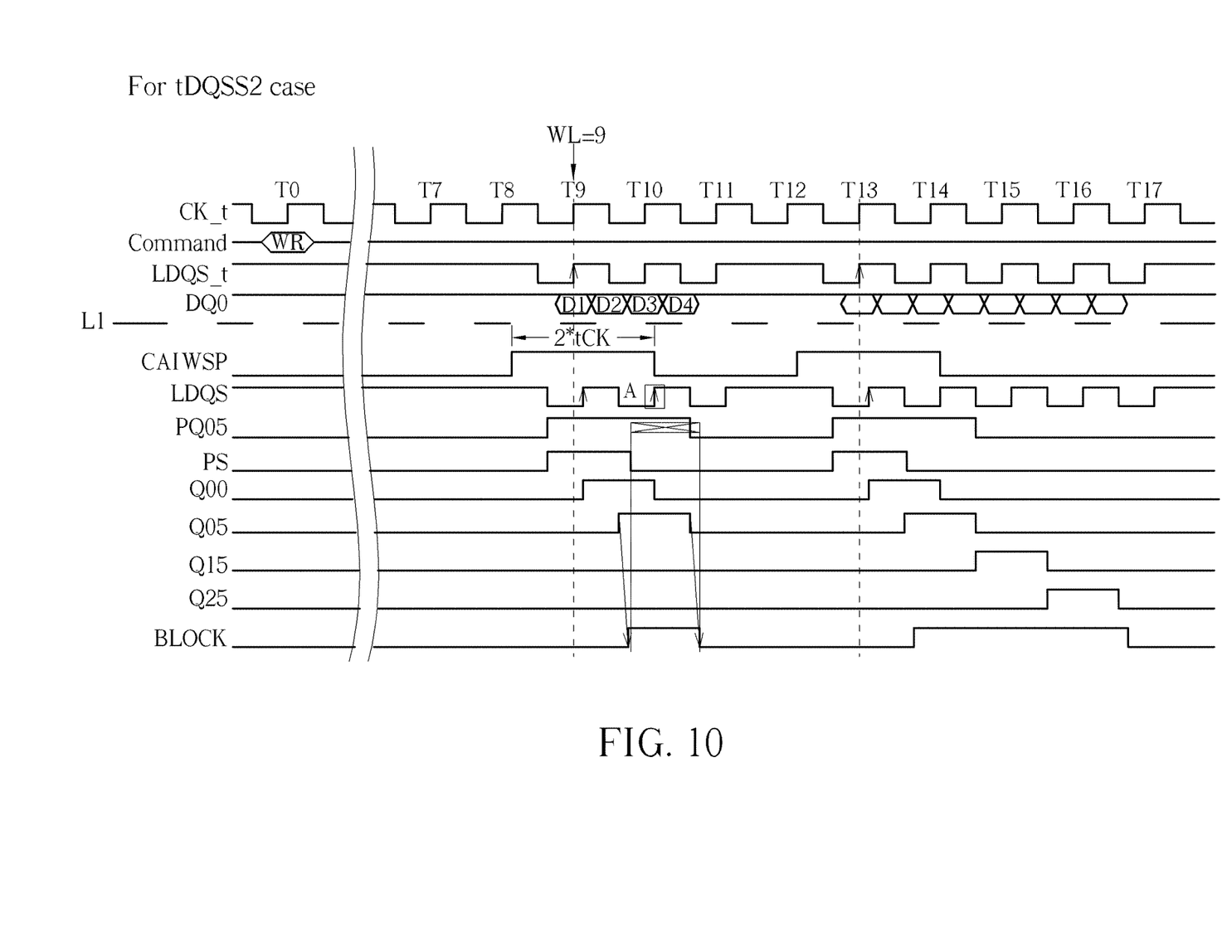
FIG. 10 is a timing diagram of a clock signal, a DQS signal, a data window signal, and a plurality of data timing-labeled signals obtained by the data control circuit shown in FIG. 3 for tDQSS2 case according to another embodiment of the present invention.

FIG. 10 is a timing diagram of a clock signal, a DQS signal, a data window signal, and a plurality of data timing-labeled signals obtained by the data control circuit 300 shown in FIG. 3 for tDQSS2 case according to another embodiment of the present invention. It is assumed that the plurality of DQ signals DQ0-DQ7 (DQ1-DQ7 not shown in FIG. 10) that correspond to 4 write data (i.e. the write format BL4) are transmitted to the data control circuit 300, wherein the 4 write data are labeled as "D1-D4" in FIG. 10, respectively. As shown in FIG. 10, the write command WR corresponding to the write format BL4 is given at the time point T0, and the write latency WL is equal to 9. During the period spanning from time point T9 to time point T13, only the second data timing-labeled signal Q05 is arranged to label the 4 write data (i.e. the constant levels of the third data timing-labeled signal Q15 and the fourth data timing-labeled signal Q25 are both equal to 0), and the block signal BLOCK is equal to the second data timing-labeled signal Q05 due to an OR operation.

In this embodiment having the self-block circuit 22 implemented in the data control circuit 300, since the block signal BLOCK is high at position A, the level of the protection signal PS (which is derived from ANDing the signal PQ05 and an inverse of the block signal BLOCK (i.e. the self-block signal SBS)) is low at the position A, which makes the first data timing-labeled signal Q00 become a low level signal at the position A. As a result, the timings of the second data timing-labeled signal Q05, the third data timing-labeled signal Q15, and the fourth data timing-labeled signal Q25 may be correct, and the 4 write data may be written into the memory cell circuit 14 correctly by using the data control circuit 300 of the present invention. After the time point T13, the write format is transferred from the write format BL4 to the write format BL8. For brevity, similar description is omitted here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data control circuit, comprising:
   a first latch circuit, having a first clock port, a first input port, and a first output port, wherein the first clock port is arranged to receive a first clock that is derived from a data strobe (DQS) signal, and the first input port is arranged to receive a data window signal;
   a self-block circuit, coupled to the first output port of the first latch circuit, and arranged to generate a protection signal according to an output at the first output port of the first latch circuit and a self-block signal;
   a second latch circuit, having a second clock port, a second input port, and a second output port, wherein the second clock port is arranged to receive a second clock that is derived from the DQS signal, the first clock is an inverse of the second clock, the second input port is coupled to the self-block circuit, and is arranged to receive the protection signal, and the second output port is arranged to output a first data timing-labeled signal;
   a third latch circuit, having a third clock port, a third input port, and a third output port, wherein the third clock port is arranged to receive the first clock, the third input port is coupled to the second output port of the second latch circuit, and is arranged to receive the first data timing-labeled signal, and the third output port is arranged to output a second data timing-labeled signal;
   a third data timing-labeled signal generating circuit, coupled to the third output port of the third latch circuit, and arranged to generate a third data timing-labeled signal according to the second data timing-labeled signal; and
   a fourth data timing-labeled signal generating circuit, coupled to the third data timing-labeled signal generating circuit, and arranged to generate a fourth data timing-labeled signal according to the third data timing-labeled signal.

2. The data control circuit of claim 1, wherein the data window signal represents maximum and minimum tolerance values of a skew between a memory clock signal and the DQS signal.

3. The data control circuit of claim 1, wherein timings of a plurality of data to be written that are transmitted to the memory cell circuit are labeled sequentially by the second data timing-labeled signal and the fourth data timing-labeled signal.

4. The data control circuit of claim 1, wherein the self-block circuit is further arranged to generate the self-block signal according to the second data timing-labeled signal, the third data timing-labeled signal, and the fourth data timing-labeled signal.

5. The data control circuit of claim 4, wherein the self-block circuit comprises:
   a NOR gate circuit, arranged to receive the second data timing-labeled signal, the third data timing-labeled signal, and the fourth data timing-labeled signal, to generate the self-block signal; and
   an AND gate circuit, coupled to the first output port of the first latch circuit and the NOR gate circuit, and arranged to receive the output at the first output port of the first latch circuit and the self-block signal, to generate the protection signal.

6. The data control circuit of claim 1, wherein each of the first latch circuit, the second latch circuit, and the third latch circuit is a D-latch circuit.

7. The data control circuit of claim 1, wherein the third data timing-labeled signal generating circuit comprises:
a fourth latch circuit, having a fourth clock port, a fourth input port, and a fourth output port, wherein the fourth clock port is arranged to receive the second clock, and the fourth input port is coupled to the third output port of the third latch circuit, and is arranged to receive the second data timing-labeled signal; and
a fifth latch circuit, having a fifth clock port, a fifth input port and a fifth output port, wherein the fifth clock port is arranged to receive the first clock, the fifth input port is coupled to the fourth output port of the fourth latch circuit, and is arranged to receive an output at the fourth output port of the fourth latch circuit, and the fifth output port is arranged to output the third data timing-labeled signal.

8. The data control circuit of claim 7, wherein each of the first latch circuit, the second latch circuit, the third latch circuit, the fourth latch circuit, and the fifth latch circuit is a D-latch circuit.

9. The data control circuit of claim 1, wherein the fourth data timing-labeled signal generating circuit comprises:
a fourth latch circuit, having a fourth clock port, a fourth input port, and a fourth output port, wherein the fourth clock port is arranged to receive the second clock, and the fourth input port is coupled to the third data timing-labeled signal generating circuit, and is arranged to receive the third data timing-labeled signal; and
a fifth latch circuit, having a fifth clock port, a fifth input port, and a fifth output port, wherein the fifth clock port is arranged to receive the first clock, the fifth input port is coupled to the fourth output port of the fourth latch circuit, and is arranged to receive an output at the fourth output port of the fourth latch circuit, and the fifth output port is arranged to output the fourth data timing-labeled signal.

10. The data control circuit of claim 9, wherein each of the first latch circuit, the second latch circuit, the third latch circuit, the fourth latch circuit, and the fifth latch circuit is a D-latch circuit.

11. The data control circuit of claim 1, wherein the first clock is an inverse of the DQS signal, and the second clock is the DQS signal.

12. A memory device, comprising:
a command input interface, arranged to receive a plurality of command signals;
a command decoder, coupled to the command input interface, and arranged to receive and decode the plurality of command signals, to generate a data window signal and a control signal, wherein the data window signal corresponds to a write command;
a memory cell circuit, coupled to the command decoder, and having a plurality of memory banks, wherein the memory cell circuit is controlled by the control signal;
a data input/output (I/O) interface, arranged to receive a plurality of data (DQ) signals and a data strobe (DQS) signal, wherein the plurality of DQ signals correspond to a plurality of data to be written, and are transmitted in series communication; and
a data processing circuit, comprising:
a series to parallel circuit, coupled to the data I/O interface and the memory cell circuit, and arranged to transfer the plurality of DQ signals into a plurality of DQ input signals according to the DQS signal, a second data timing-labeled signal, and a fourth data timing-labeled signal, wherein the plurality of DQ input signals is transmitted to the memory cell circuit in parallel communication; and
a data control circuit, coupled to the command decoder, the data I/O interface, and the series to parallel circuit, and comprising:
a first latch circuit, having a first clock port, a first input port, and a first output port, wherein the first clock port is arranged to receive a first clock that is derived from the DQS signal, and the first input port is arranged to receive the data window signal;
a self-block circuit, coupled to the first output port of the first latch circuit, and arranged to generate a protection signal according to an output at the first output port of the first latch circuit and a self-block signal;
a second latch circuit, having a second clock port, a second input port, and a second output port, wherein the second clock port is arranged to receive a second clock that is derived from the DQS signal, the first clock is an inverse of the second clock, the second input port is coupled to the self-block circuit, and is arranged to receive the protection signal, and the second output port is arranged to output a first data timing-labeled signal;
a third latch circuit, having a third clock port, a third input port, and a third output port, wherein the third clock port is arranged to receive the first clock, the third input port is coupled to the second output port of the second latch circuit, and is arranged to receive the first data timing-labeled signal, and the third output port is arranged to output the second data timing-labeled signal;
a third data timing-labeled signal generating circuit, coupled to the third output port of the third latch circuit, and arranged to generate a third data timing-labeled signal according to the second data timing-labeled signal; and
a fourth data timing-labeled signal generating circuit, coupled to the third data timing-labeled signal generating circuit, and arranged to generate the fourth data timing-labeled signal according to the third data timing-labeled signal.

* * * * *